(12) United States Patent
Okinoi (10) Patent No.: US 7,768,310 B2
(45) Date of Patent: Aug. 3, 2010

(54) SEMICONDUCTOR DEVICE, METHOD OF SWITCHING DRIVE CAPABILITY OF THE SEMICONDUCTOR DEVICE, AND SYSTEM INCLUDING SEMICONDUCTOR DEVICES

(75) Inventor: Masanori Okinoi, Tokyo (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 12/061,458

(22) Filed: Apr. 2, 2008

(65) Prior Publication Data

US 2008/0246531 A1 Oct. 9, 2008

(30) Foreign Application Priority Data

Apr. 3, 2007 (JP) .......................... P.2007-097349

(51) Int. Cl.
*H03K 19/00* (2006.01)
(52) U.S. Cl. .......................................... 326/82; 326/87

(58) Field of Classification Search .................. 326/26, 326/27, 30, 82–87
See application file for complete search history.

(56) References Cited

U.S. PATENT DOCUMENTS

| 6,563,337 B2 * | 5/2003 | Dour ........................... 326/30 |
| 6,732,217 B1 | 5/2004 | Nishikido |
| 6,943,588 B1 * | 9/2005 | Luo et al. ...................... 326/86 |
| 7,177,283 B2 | 2/2007 | Fukae et al. |
| 7,301,375 B2 * | 11/2007 | Song ........................... 327/108 |
| 7,423,454 B2 * | 9/2008 | Stojanovic et al. ............ 326/83 |

FOREIGN PATENT DOCUMENTS

| JP | 05-166931 | 7/1993 |
| JP | 2000-132975 | 5/2000 |

* cited by examiner

*Primary Examiner*—Don P Le
(74) *Attorney, Agent, or Firm*—McDermott Will & Emery LLP (57) ABSTRACT

A semiconductor device connected to other semiconductor device, includes a control portion which controls a drive capability for the other semiconductor device based on control information for the other semiconductor device.

6 Claims, 8 Drawing Sheets

| CLK TERMINAL | OUTPUT CURRENT (mA) | OUTPUT VOLTAGE (V) | OUTPUT IMPEDANCE (Ω) |
|---|---|---|---|
| cnt SIGNAL LOGIC L | 60 | 3.7 | 25 |
| cnt SIGNAL LOGIC H | 30 | 3 | 50 |

FIG. 4

| ADQ[15:0] TERMINAL | OUTPUT CURRENT (mA) | OUTPUT VOLTAGE (V) | OUTPUT IMPEDANCE (Ω) |
|---|---|---|---|
| cnt SIGNAL LOGIC L | 30 | 3.3 | 40 |
| cnt SIGNAL LOGIC H | 50 | 5 | 50 |

SEMICONDUCTOR DEVICE, METHOD OF SWITCHING DRIVE CAPABILITY OF THE SEMICONDUCTOR DEVICE, AND SYSTEM INCLUDING SEMICONDUCTOR DEVICES

BACKGROUND

The present invention relates to a semiconductor device. More specifically, it relates to a method of switching drive capability of each output terminal of the semiconductor device.

The speed of signals transmitted between semiconductor devices has been made higher with the advance of increase in speed of the semiconductor devices. The waveform of each signal transmitted between the semiconductor devices is distorted due to other factors than the semiconductor devices (e.g. a method for designing a printed circuit board, fluctuation in source voltage, etc.). Specifically, there may arise a case where signals cannot be transmitted correctly due to the influence of an overshoot or undershoot.

Ordinarily, in a system including semiconductor devices, a transmitter-side first semiconductor device is connected to a receiver-side second or third semiconductor device. On this occasion, matching a transmission line between the first semiconductor device and the second semiconductor device with characteristic impedance of each of the semiconductor devices permits the waveform of each transmission signal to be prevented from being distorted (Patent Document 1).

When the receiver-side second and third semiconductor devices are connected to the transmitter-side first semiconductor device, it is possible to achieve impedance matching between the first and second semiconductor devices and impedance matching between the first and third semiconductor devices individually but it is difficult to achieve impedance matching so simultaneously as to satisfy both.

For example, this goes for the case where a high-speed clock synchronous flash memory or an asynchronous peripheral device as the second or third semiconductor device is connected to the transmitter-side first semiconductor device.

Figure 2:
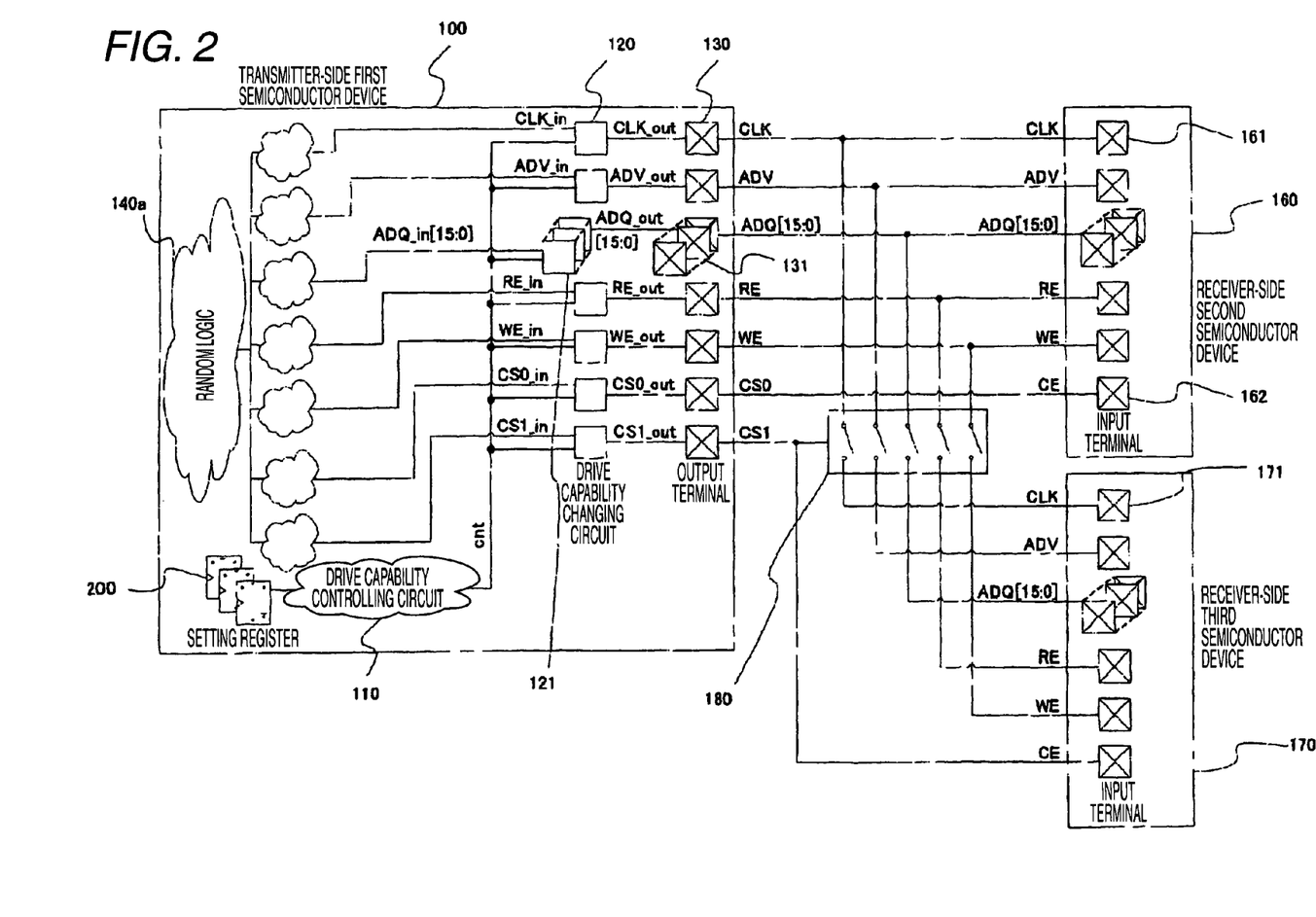
FIG. 2 is a view showing the configuration of a system including semiconductor devices according to the background art.

FIG. 2 is a view showing the configuration of a system including semiconductor devices 100, 160 and 170 according to the background art. In the background art, drive capabilities of output terminals 130 in the transmitter-side first semiconductor device 100 are determined based on the contents of setting registers 200 independently of control information.

[Patent Document 1] JP-A-5-166931
[Patent Document 2] JP-A-2000-132975

In the system design according to the background art, the drive capability of each output terminal 130 of the transmitter-side first semiconductor device 100 is designed or set to match with one of the receiver-side semiconductor devices 160 and 170 requiring the largest drive capability.

On this occasion, to solve the problem of an overshoot or undershoot in the case where the drive capability is higher than what is required, measures such as insertion of damping resistors in transmission lines are taken for impedance matching so that waveform shaping is performed in accordance with the receiver-side semiconductor device 160 or 170 to thereby secure signal transmission.

Although it is possible to secure transmission for the receiver-side second or third semiconductor device 160 or 170 by waveform shaping using damping resistors etc. or measures taken only on the side of the receiver-side semiconductor device 160 or 170 (Patent Document 2), it is impossible to set the drive capability of each output terminal 130 of the transmitter-side first semiconductor device 100 to necessary and sufficient drive capability for the receiver-side second or third semiconductor device 160 or 170. Thus, there is a problem that electric power consumed by the system including the receiver-side second and third semiconductor devices 160 and 170 increased.

SUMMARY

The present invention is developed under the aforementioned circumstances of the background art. An object of the invention is to provide a semiconductor device serving as a transmitter-side semiconductor device whose drive capabilities can be set to drive capabilities necessary and sufficient for receiver-side semiconductor devices, and a method and system for controlling the drive capabilities of the semiconductor device.

The semiconductor device according to the invention is a semiconductor device connected to other semiconductor devices, the semiconductor device includes a control portion which controls a drive capability for the other semiconductor device based on control information for the other semiconductor device.

According to this configuration, it is possible to set the drive capabilities for the receiver-side semiconductor devices to necessary and sufficient drive capabilities, so that security of transmission from the transmitter side to the receiver side can be achieved while electric power consumed by the transmitter-side semiconductor device is reduced.

Preferably, the semiconductor device further includes an output terminal which outputs a signal to the other semiconductor device. The control portion controls an output current in the output terminal based on the control information for the other semiconductor device.

Also, the semiconductor device further includes an output terminal which outputs a signal to the other semiconductor device. The control portion controls an output voltage in the output terminal based on the control information for the other semiconductor device.

Also, the semiconductor device further includes an output terminal which outputs a signal to the other semiconductor device. The control portion controls an output impedance in the output terminal based on the control information for the other semiconductor device.

According to this configuration, it is possible to set the output current, the output voltage or the output impedance in the output terminal to necessary and sufficient value suitable for the receiver-side semiconductor device, so that it is possible to reduce electric power consumed by the transmitter-side semiconductor device.

Preferably, the semiconductor device further includes a drive capability controlling circuit which generates a control signal based on an address value corresponding to the other semiconductor device to be active, and a drive capability changing circuit which sets the output terminal to have a drive capability corresponding to the other semiconductor device to be active based on the control signal.

Here, it is preferable that the semiconductor device includes the drive capability controlling circuit and a drive capability changing circuit which sets the output terminal to have a drive capability corresponding to the other semiconductor device to be active based on the control signal.

Here, it is preferable that the semiconductor device includes the drive capability controlling circuit and a drive capability changing circuit which sets the output terminal to have a drive capability corresponding to the other semiconductor device to be active based on the control signal.

Preferably, the drive capability changing circuit has an output current determining circuit for setting the output current in accordance with the control signal.

Preferably, the drive capability changing circuit has an output voltage determining circuit for setting the output voltage in accordance with the control signal.

Preferably, the drive capability changing circuit has an output impedance determining circuit for determining the output impedance in accordance with the control signal.

According to this configuration, it is possible to set the drive capability of each output terminal to drive capability suitable for each receiver-side semiconductor device even in the case where a plurality of receiver-side semiconductor device is present, so that it is possible to reduce consumed electric power.

The method according to the invention is a method of controlling a drive capability of a semiconductor device connected to other semiconductor device, comprising:

generating control information for the other semiconductor device; and controlling the drive capability for the other semiconductor device based on the generated control information.

In addition, the method according to the invention further includes the step of controlling an output current in an output terminal provided in the semiconductor device for outputting a signal to the other semiconductor device, based on the control information.

Moreover, the method according to the invention further includes the step of controlling an output voltage in an output terminal provided in the semiconductor device for outputting a signal to the other semiconductor device, based on the control information.

Further, the method according to the invention further includes the step of controlling an output impedance in an output terminal provided in the semiconductor device for outputting a signal to the other semiconductor device, based on the control information.

The system according to the invention is a system having a plurality of semiconductor devices connected to one another, one of the semiconductor devices controls drive capabilities for the other semiconductor devices, based on control information for the other semiconductor devices. In addition, in the system according to the invention, output currents in output terminals provided in the one of the semiconductor devices for outputting signals to the other semiconductor devices are controlled. Moreover, in the system according to the invention, output voltages in output terminals provided in the one of the semiconductor devices for outputting signals to the other semiconductor devices are controlled. Further, in the system according to the invention, output impedances in output terminals provided in the one of the semiconductor devices for outputting signals to the other semiconductor devices are controlled.

According to this configuration, it is possible to optimally set the drive capability of each output terminal, so that electric power consumed by the system as a whole can be reduced in addition to security of transmission between the semiconductor devices. By reducing the number of additional parts such as damping resistors required heretofore, it is possible to reduce the system cost or mounting space and further improve reliability of the system as a whole.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the invention will be hereinafter described in detail with reference to the drawings. In the drawings, like numerals refer to like or equivalent parts.

Figure 1:
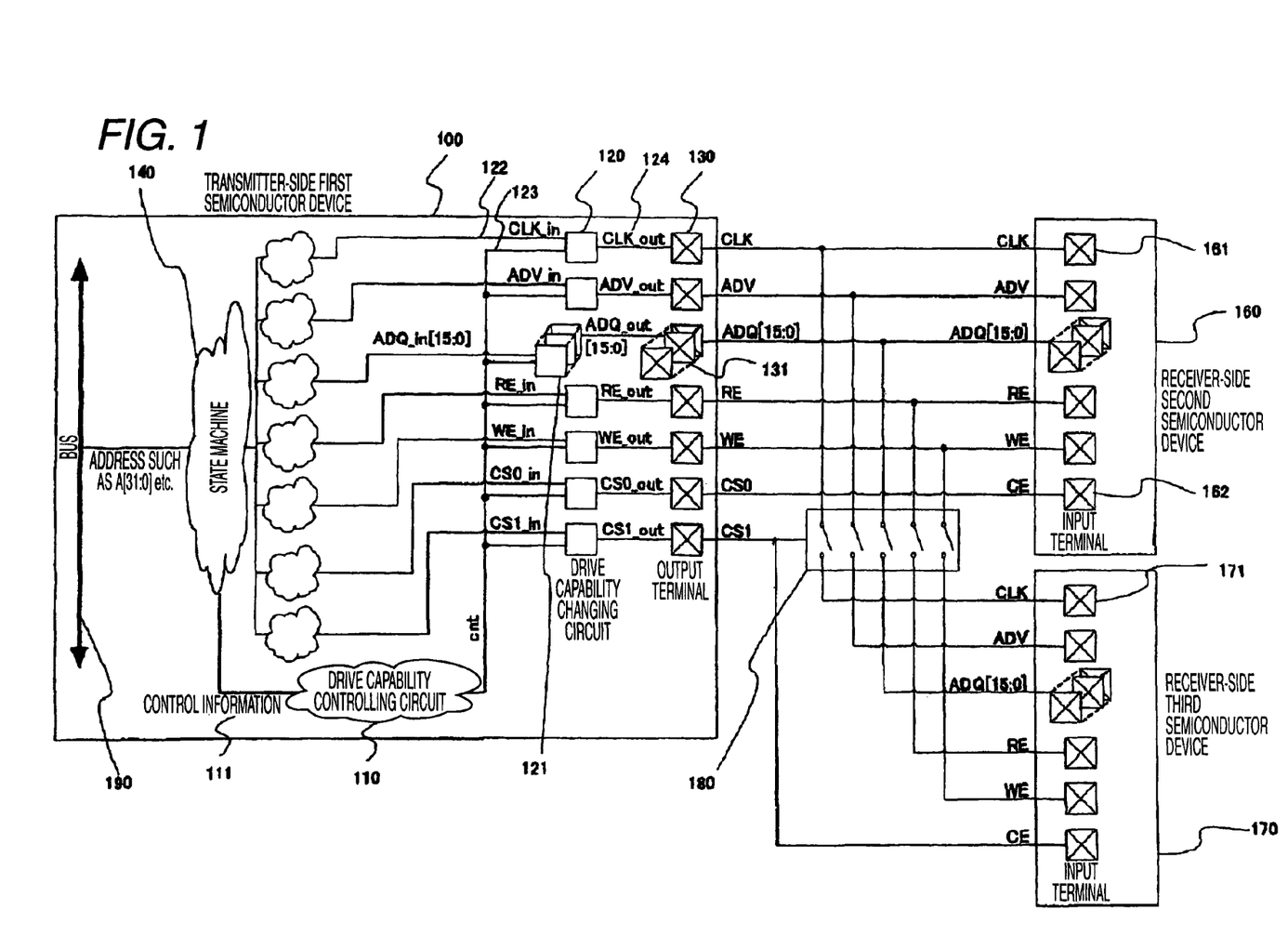
FIG. 1 is a view showing the configuration of a system including semiconductor devices according to an embodiment of the invention.

FIG. 1 shows an example of the configuration of a system including semiconductor devices according to the embodiment of the invention. Specifically, the system includes a transmitter-side first semiconductor device 100, a receiver-side second semiconductor device 160, a receiver-side third semiconductor device 170, and a circuit cutting-off switch 180.

The transmitter-side first semiconductor device 100 includes output terminals 130 connected respectively to input terminals of the receiver-side second and third semiconductor devices 160 and 170, a state machine 140 for outputting control information 111 generated in accordance with states of the output terminals 130, a drive capability controlling circuit 110 for generating a control signal cnt for setting drive capability corresponding to an activated receiver-side semiconductor device (receiver-side second or third semiconductor device 160 or 170) to each output terminal 130 based on the control information 111, and drive capability changing circuits 120 for changing the drive capabilities of the output terminals 130 based on the control signals cnt generated by the drive capability controlling circuit 110. The output terminals 130 of the transmitter-side first semiconductor device 100 are connected respectively to the input terminals of the receiver-side second and third semiconductor devices 160 and 170 through signal lines by which several signals (CLK, ADV, ADQ[15:0], RE, WE, CS0, and CS1 in this case) are transmitted respectively.

In FIG. 1, the CS0 signal or CS1 signal and other signals, i.e. CLK, ADV, ADQ[15:0], RE and WE signals, are activated with drive capability designed or set in advance in accordance with the control information 111 when the CS0 signal is in an active state (e.g. logic L in the case of negative logic) for the receiver-side second semiconductor device 160 or when the CS1 signal is in an active state for the receiver-side third semiconductor device 170.

Differently from the background art, the semiconductor device 100 according to the invention has the configuration in which the drive capability changing circuits 120 connected to the output terminals 130 respectively are controlled by the cnt signals 123 generated by the drive capability controlling circuit 110 based on the control information 111 such as an address A[31:0] of a bus 190 etc. so that the drive capability of each output terminal 130 of the transmitter-side first semiconductor device 100 is set at a necessary and sufficient value in accordance with the signal outputted from each drive capability changing circuit 120. For example, the address A[31:00] of the bus 190 indicates an address value corresponding to the activated receiver-side second semiconductor device 160.

Figure 6:
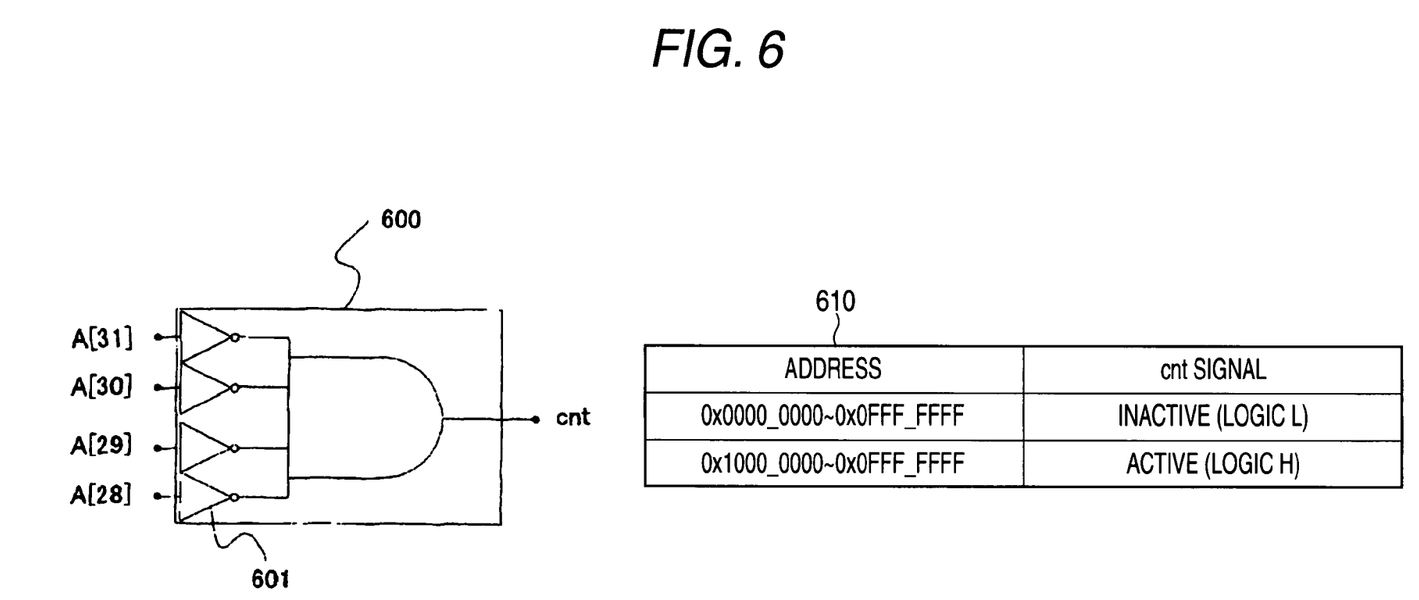
FIG. 6 is a view showing an example of the configuration of a drive capability controlling circuit 110 of the semiconductor device according to the embodiment of the invention.

Each cnt signal 123 outputted from the drive capability controlling circuit 110 is set to be in an active state, for example, in accordance with the logic illustrated in a table 610 shown in FIG. 6. As a specific example, the drive capability controlling circuit 110 may be formed like a circuit 600 by using the address A[31:0] of the bus 190 and an inverter 601.

Figure 7:
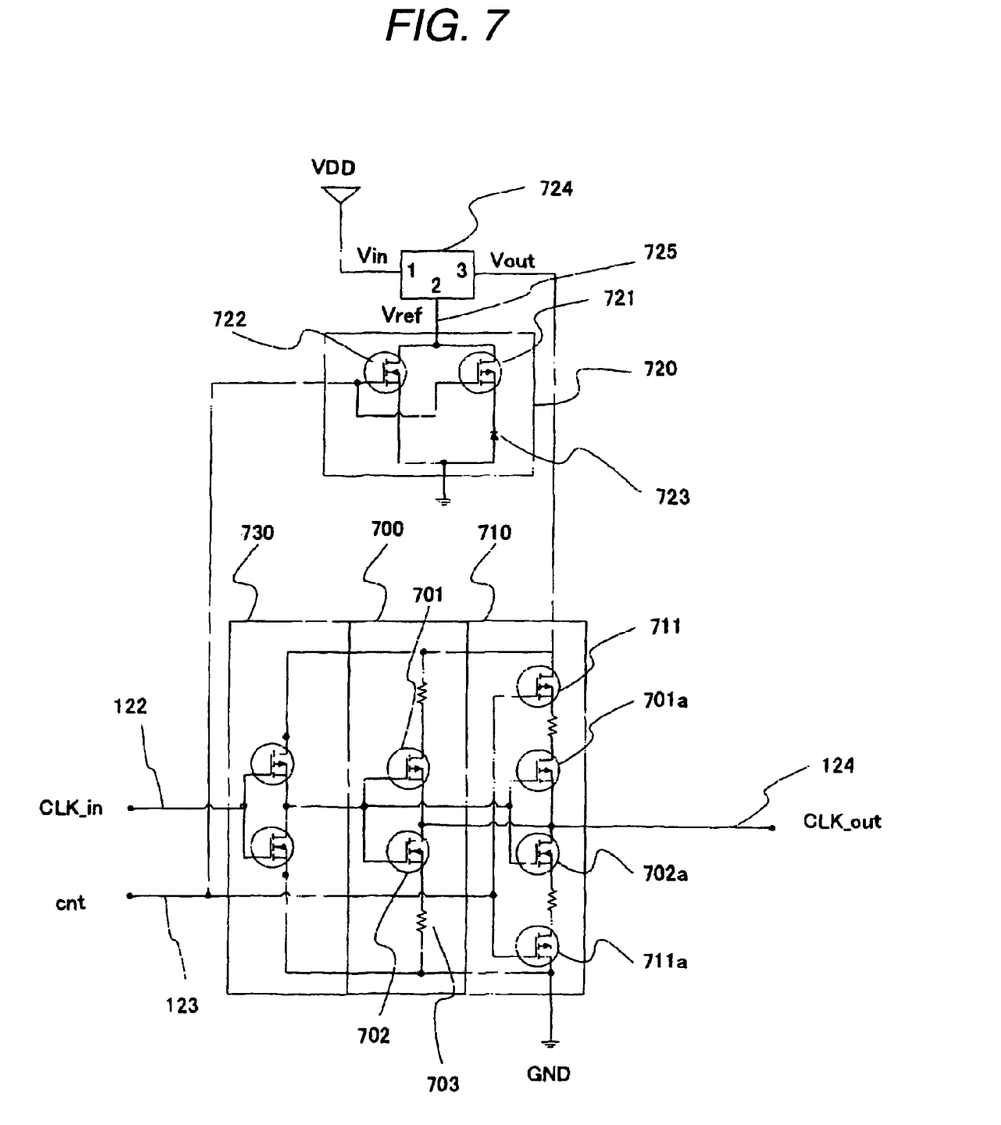
FIG. 7 is a view showing an example of the configuration of a drive capability changing circuit 120 of the semiconductor device according to the embodiment of the invention.

As a specific example, each drive capability changing circuit 120 may be formed as shown in FIG. 7. Upon reception of inputs of a CLK_in signal 122 based on the state and a cnt signal 123 outputted from the drive capability controlling circuit 110, the drive capability changing circuit 120 shown in FIG. 7 outputs a CLK signal which is a signal for setting the drive capability of an output terminal 130. The drive capability changing circuit 120 shown in FIG. 7 roughly includes four portions. That is, the drive capability changing circuit 120 shown in FIG. 7 includes a first output circuit 700 for determining an output current and an output impedance, a second output circuit 710 for determining an output current and an output impedance based on a state of a cnt signal 123, an output voltage determining circuit 720 for determining an output voltage applied to the output terminal 130 based on the state of the cnt signal 123, and an input inverting circuit 730.

The first output circuit 700 includes a P-channel transistor 701, an N-channel transistor 702, and 50Ω resistors 703 (all resistors in FIG. 7 are set to have the same value as the resistor 703). The second output circuit 710 includes a P-channel transistor 701a, an N-channel transistor 702a, and P-channel transistors 711 and 711a which are turned on when the cnt signal 123 is the logic L.

For example, the output voltage determining circuit 720 has a three-terminal regulator 724. The electric potential of a reference voltage (Vref) terminal 725 of the three-terminal regulator 724 is controlled by a P-channel transistor 721 and an N-channel transistor 722. When the P-channel transistor 721 is in an ON state (the cnt signal 123 is the logic L), the electric potential of the Vref terminal 725 can be raised by a diode 723 (e.g. 0.7V in the case where the diode 723 is a general silicon diode).

Figure 5:
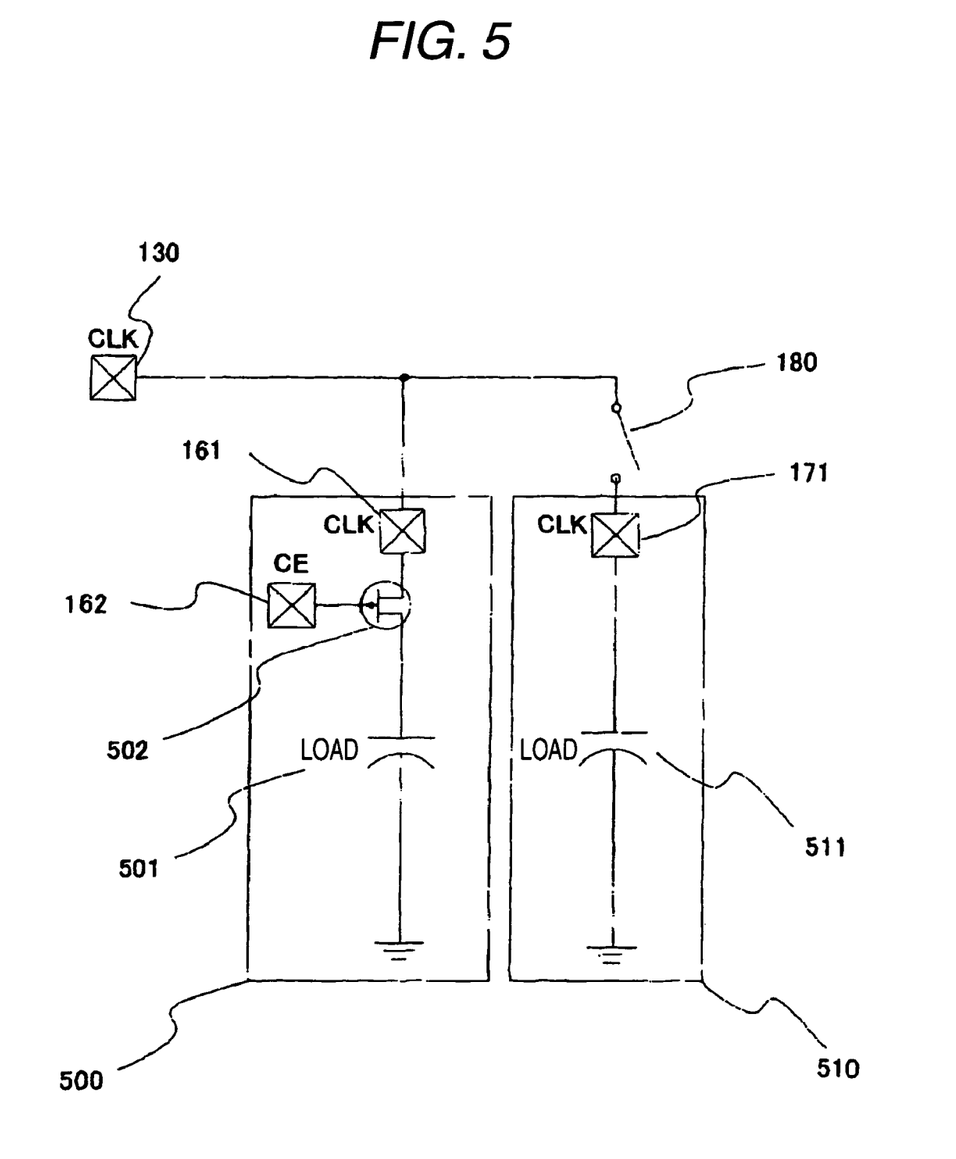
FIG. 5 is a view showing an example of modeling of a transmission line for a CLK signal in the semiconductor device according to the embodiment of the invention.

For example, with respect to the CLK signal, assume that the receiver-side second semiconductor device 160 can be modeled in a device 502 for performing electrical cutting-off and a load 501 as represented by a model 500 shown in FIG. 5, and that the receiver-side third semiconductor device 170 can be modeled in a circuit cutting-off switch 180 for performing electrical and mechanical cutting-off and a load 511 as represented by a model 510 shown in FIG. 5 (the device 502 and the circuit cutting-off switch 180 are exclusively turned on/off by the state machine 140).

Figure 3:
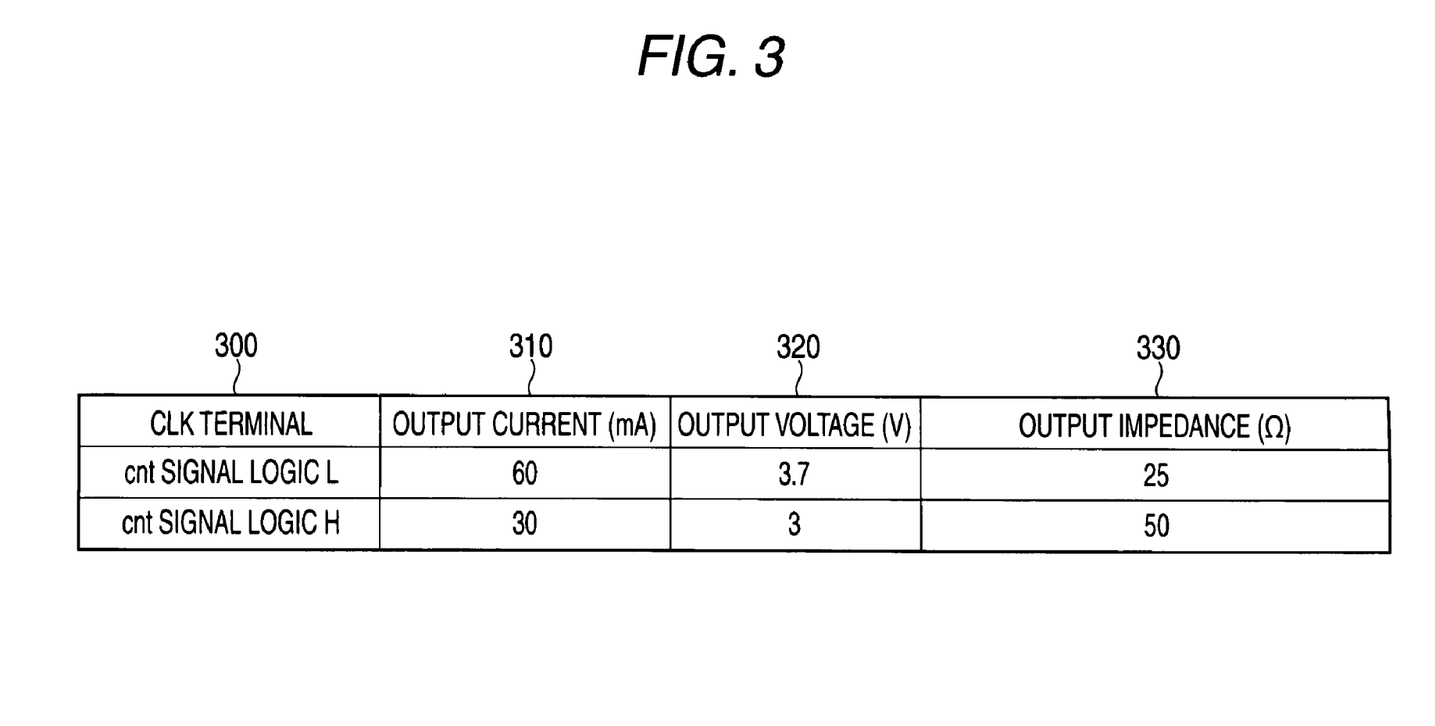
FIG. 3 is a table showing an example in which drive capabilities of output terminals of a semiconductor device according to the embodiment of the invention are set respectively and independently in accordance with the terminals.

On this occasion, assume that setting of the drive capability changing circuit 120 optimal for the model 500 and the model 510 with respect to the CLK signal is performed as shown in FIG. 3. FIG. 3 shows an example of design or setting of the drive capability of the output terminal 130 of the first semiconductor device 100 with respect to the CLK signal.

Figure 8:
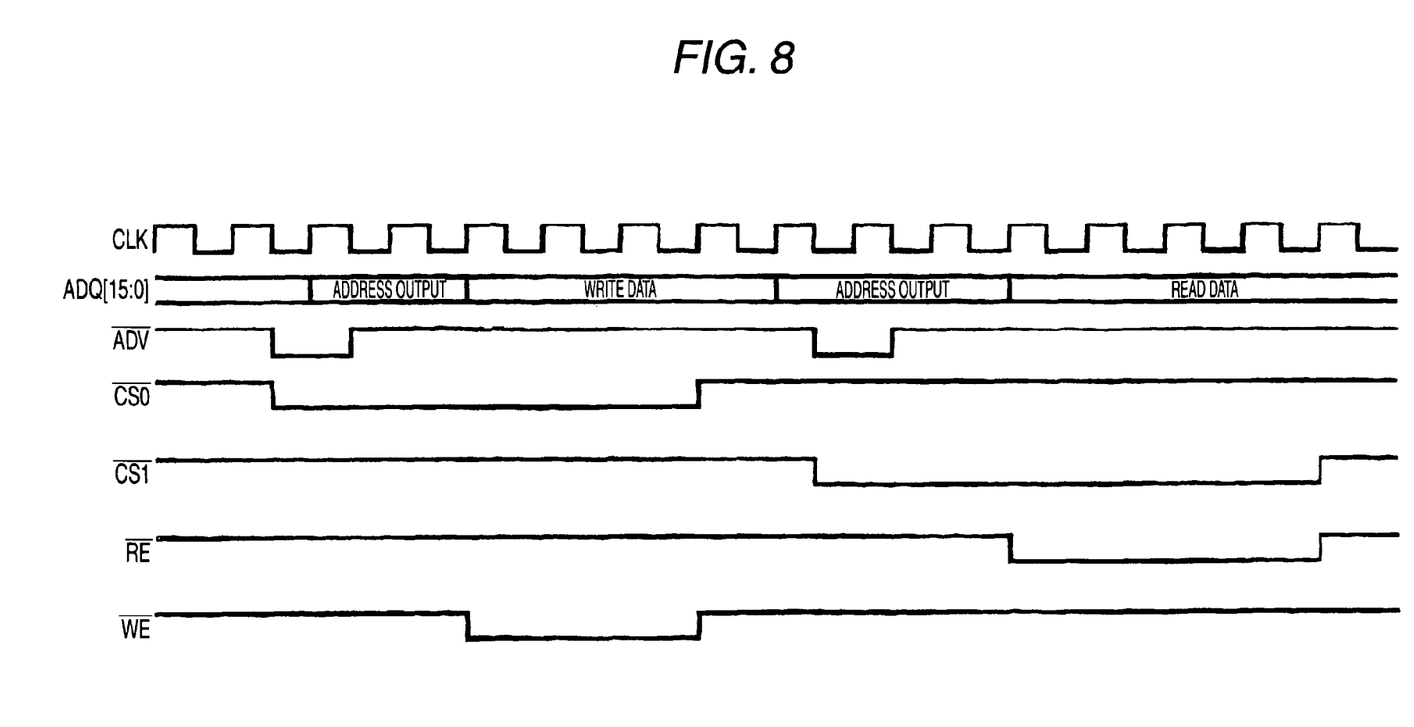
FIG. 8 is a view showing an ADQ[15:0] signal in the semiconductor device according to the embodiment of the invention.

Here, the drive capability may be presumed to be an output current 310, an output voltage 320 or an output impedance 330. In the case of a signal of bits (an ADQ[15:0] signal used here by time division as an address and data signal: refer to FIG. 8), similar setting may be performed on each signal bit as shown in FIG. 4.

In the case where there is thus provided a portion capable of performing electrical cutting-off when the receiver-side second and third semiconductor devices 160 and 170 are in an inactive state, the load 501 or 511 on an inactive object connected to the transmission line can be reduced.

Figure 4:
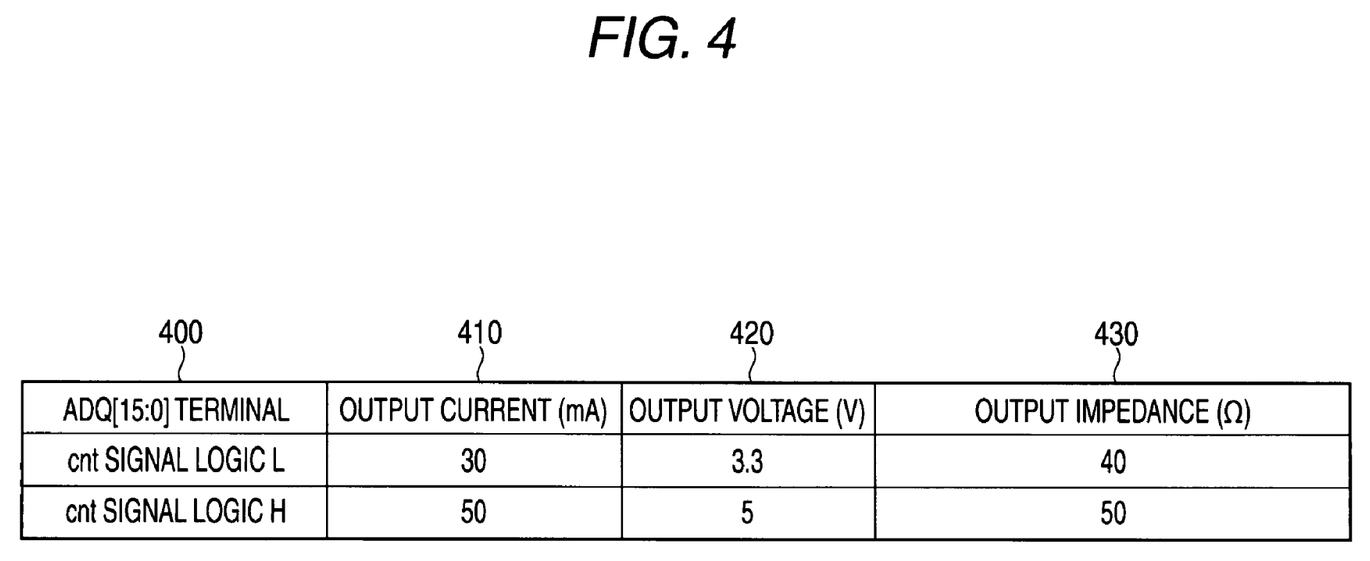
FIG. 4 is a table showing an example in which drive capabilities of output terminals of the semiconductor device according to the embodiment of the invention are set respectively and independently in accordance with terminal groups.

When the drive capability optimal for a semiconductor device as an active object is set as shown in FIGS. 3 and 4 on this occasion, electric power consumed by the system including the transmitter-side first semiconductor device 100 can be reduced as a whole in addition to security of signal transmission.

When there are a plurality of receiver-side semiconductor devices, it is possible to set drive capability of each output terminal optimally for each of the receiver-side semiconductor devices so that it is possible to reduce the number of additional parts such as damping resistors required heretofore, and it is possible to reduce the system cost or mounting space or improve reliability of the system as a whole in accordance with reduction in the number of additional parts.

It should be considered that the embodiment disclosed here is not limited but only provided for illustration in all respects. The scope of the invention is not limited to the above description but is defined by the scope of claims. The scope of the invention is intended to include all changes equivalent in meaning and scope to the scope of claims.

The semiconductor device according to the invention has circuits for changing drive capabilities of respective terminals based on control information inside the device, so that the semiconductor device is useful as a device which can make it possible to reduce electric power consumed by a system.

The present application is based on Japan Patent Application No. 2007-097349 filed on Apr. 3, 2007, the contents of which are incorporated herein for reference.

What is claimed is:

1. A semiconductor device connected to other semiconductor device, the semiconductor device comprising:
   a drive capability controlling circuit which generates a control signal based on an address value corresponding to the other semiconductor device to be active;
   an output terminal which outputs a signal to the other semiconductor device; and a control portion which controls, for the other semiconductor device, a drive capability of the output terminal based on the control signal generated in the semiconductor device.

2. The semiconductor device according to claim 1, wherein the control portion controls an output current in the output terminal based on the control signal.

3. The semiconductor device according to claim 1, wherein the control portion controls an output voltage in the output terminal based on the control signal.

4. The semiconductor device according to claim 1, wherein the control portion controls an output impedance in the output terminal based on the control signal.

5. The semiconductor device according to claim 1, wherein the control portion includes a drive capability changing circuit which sets the output terminal to have a drive capability corresponding to the other semiconductor device to be active based on the control signal.

6. The semiconductor device according to claim 5, wherein the drive capability changing circuit has an output current determining circuit for setting the output current in accordance with the control signal.

* * * * *